(12) United States Patent
Kwean

(10) Patent No.: US 7,319,342 B2
(45) Date of Patent: *Jan. 15, 2008

(54) DATA ACCELERATION DEVICE AND DATA TRANSMISSION APPARATUS USING THE SAME

(75) Inventor: Ki Chang Kwean, Icheon-si (KR)

(73) Assignee: Hynix Semiconductor Inc., Icheon-Shi (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/671,564

(22) Filed: Feb. 6, 2007

(65) Prior Publication Data

US 2007/0126461 A1    Jun. 7, 2007

Related U.S. Application Data

(63) Continuation of application No. 11/146,877, filed on Jun. 7, 2005, now Pat. No. 7,256,609.

(30) Foreign Application Priority Data

Oct. 7, 2004    (KR) ............................... 2004-80124

(51) Int. Cl.
H03K 17/16    (2006.01)
H03K 19/003    (2006.01)

(52) U.S. Cl. .............................. 326/26; 326/17; 326/27

(58) Field of Classification Search ................ 326/17, 326/26–27, 82–83, 86, 90; 327/108–112
See application file for complete search history.

(56) References Cited

U.S. PATENT DOCUMENTS

| 5,119,340 A | 6/1992 | Slemmer |
| 5,121,358 A | 6/1992 | Slemmer et al. |
| 5,124,951 A | 6/1992 | Slemmer et al. |
| 5,128,897 A | 7/1992 | McClure |
| 5,311,076 A | 5/1994 | Park et al. |
| 5,526,318 A | 6/1996 | Slemmer et al. |
| 6,236,237 B1 | 5/2001 | Wong et al. |
| 2001/0026178 A1* | 10/2001 | Itoh et al. .................... 327/112 |
| 2006/0076976 A1 | 4/2006 | Kwean |

FOREIGN PATENT DOCUMENTS

| JP | 03-265242 | 11/1991 |
| JP | 05-266668 | 10/1993 |
| JP | 05-266669 | 10/1993 |
| JP | 05-334876 | 12/1993 |
| JP | 09-128978 | 5/1997 |
| KR | 10-2000-0043231 | 7/2000 |
| KR | 10-2000-0066939 | 11/2000 |

* cited by examiner

*Primary Examiner*—Anh Q. Tran
(74) *Attorney, Agent, or Firm*—Marshall, Gerstein & Borun LLP

(57) ABSTRACT

A data acceleration device may include a pull-up driver for driving a pull-up in response to the signal level on a first node, a pull-down driver for driving a pull-down in response to the signal level on the first node, a first pull-up circuit for pull-up driving a second node which is electrically coupled with the first node, in response to an output signal from the pull-up driver, a first pull-down circuit for pull-down driving the second node, in response to an output signal from the pull-down driver, a delay circuit for delaying a signal from the second node by a preset time to output a delayed signal, a first switch for switching an operation of the first pull-up circuit in response to an output signal from the delay circuit, and a second switch for switching an operation of the first pull-down circuit in response to the output signal from the delay circuit. Also, there is presented a data transmission apparatus including the data acceleration device.

26 Claims, 2 Drawing Sheets

DATA ACCELERATION DEVICE AND DATA TRANSMISSION APPARATUS USING THE SAME

CROSS-REFERENCE TO RELATED APPLICATIONS

This patent is a continuation of U.S. Ser. No. 11/146,877 filed Jun. 7, 2005 now U.S. Pat. No. 7,256,609, the disclosure of which is hereby expressly incorporated for all purposes.

FIELD OF THE INVENTION

The present invention relates to a data acceleration device and a data transmission apparatus using the same; and, more particularly, to a data acceleration device and a data transmission apparatus using the same, which is capable of decreasing an entire signal delay in a data transmission line of a semiconductor device with a longer transmission distance and a larger load.

DESCRIPTION OF RELATED ART

Currently, a semiconductor chip size becomes larger as a semiconductor device (particularly, DRAM) becomes more integrated. This large chip size causes an increase in the distance and a load of a signal transmission line within the DRAM. As such, as the distance and load of signal transmission line increases, a delay of data transmitted over the signal transmission line tends to degrade more and more.

To decrease this transmission delay phenomenon of the data, in general, a repeater is utilized where FIG. 1 shows a circuit diagram illustrating composition of a conventional data transmission apparatus using such a repeater.

As shown in FIG. 1, the conventional data transmission apparatus is comprised of a repeater 10 having a simple inverter chain wherein the repeater 10 functions to amplify a signal level of the data from an input port at a prescribed level and then sent it to an output port, without attenuation.

Herein, in case that an input signal is transited from low level to high level, or from a high to a low level conversely, in order to have the same delay maintained, it is designed so that the logic threshold level of each inverter constituting the repeater 10 is set to a value of (high level–low level)/2. The logic threshold level is defined as a reference signal level for each inverter to decide whether the input signal level is high or low. Thus, the repeater 10 formed by the chain of inverters as mentioned above initiates to operate when, if the input signal is transited from a low level to a high level, the signal level rises up to (high level–low level)/2. Likewise, the repeater 10 starts to operate when the input signal level comes down up to (high level–low level)/2 if the input signal is transited from high to low level.

In the prior art data transmission apparatus, accordingly, there exists any operation delay since the repeater 10 operates when the input signal rises or falls to the logic threshold level from a low or high level. Moreover, this operation delay generally results in a delay in the data transmission.

SUMMARY OF THE INVENTION

It is, therefore, a data acceleration device and a data transmission apparatus using the same may be capable of improving the performance of a semiconductor chip by preventing data delay phenomenon in a data transmission line of the semiconductor chip with a longer transmission distance and a larger load by accelerating the data signal to be transmitted rapidly.

In accordance with one aspect of the present invention, there is provided a data acceleration device comprising: a pull-up driver for driving a pull-up in response to a signal level on a first node: a pull-down driver for driving a pull-down in response to the signal level on the first node; a first pull-up circuit for pull-up driving a second node which is electrically coupled with the first node, in response to an output signal from the pull-up driver; a first pull-down circuit for pull-down driving the second node, in response to an output signal from the pull-down driver; a delay circuit for delaying a signal from the second node by a preset time to output a delayed signal; a first switch for switching an operation of the first pull-up circuit in response to an output signal from the delay circuit; and a second switch for switching an operation of the first pull-down circuit in response to the output signal from the delay circuit.

Preferably, the first pull-up driver is a first inverter for inverting the signal from the first node to provide an inverted signal.

Preferably, the first inverter has an inverting rate, that, when the signal from the first node is transited from a low to high level is faster than that when it is transitioned from a high to low level.

Preferably, the first inverter includes a first pull-up element and a first pull-down element where the pull-down capacity of the first pull-down element is larger than the pull-up capacity of the first pull-up element.

Preferably, the first pull-up element is a PMOS and the first pull-down element is an NMOS.

Preferably, the first pull-down driver is a second inverter for inverting the signal from the first node to produce an inverted signal.

Preferably, the second inverter and inverting rate, that, when the signal from the first node is transitioned from a high to low level is faster than that when it is transitioned from a loss to high level.

Preferably, the second inverter includes a second pull-up element and a second pull-down element where the pull-up capacity of the second pull-up element is larger than the pull-down capacity of the second pull-down element.

Preferably, the second pull-up element is a PMOS and the second pull-down element is an NMOS.

Preferably, the delay circuit includes an inverter chain with a plurality of inverters.

Preferably, the first pull-up circuit is a PMOS and the first pull-down element is an NMOS.

Preferably, the first switch is a PMOS and the second switch is an NMOS.

In accordance with another aspect of the present invention, there is provided a data transmission apparatus comprising: a data acceleration device, wherein the device includes a first inverter for inverting and outputting an input signal on a first node; a second inverter for inverting and outputting the input signal on the first node; a first pull-up circuit for pull-up driving a second node which is electrically coupled with the first node, in response to an output signal from the first inverter; a first pull-down circuit for pull-down driving the second node, in response to an output signal from the second inverter; a delay circuit for delaying a signal from the second node by a preset time; a first switch for switching an operation of the first pull-up circuit in response to an output from the delay circuit; and a second switch for switching an operation of the first pull-down circuit in response to the output from the delay circuit; and a repeater for amplifying an output signal from the data acceleration device to avoid an attenuation of the signal, to thereby output an amplified signal.

In accordance with still another aspect of the present invention, there is provided a data transmission data transmission apparatus comprising: a repeater for amplifying an input signal to avoid any attenuation of the signal, to thereby output an amplified signal onto a first node; and a data acceleration device, wherein the device includes a first inverter for inverting and outputting the signal on the first node; a second inverter for inverting and outputting the signal on the first node; a first pull-up circuit for pull-up driving a second node which is electrically coupled with the first node, in response to an output signal from the first inverter; a first pull-down circuit for pull-down driving the second node, in response to an output signal from the second inverter; a delay circuit for delaying a signal from the second node by a preset time; a first switch for switching an operation of the first pull-up circuit in response to an output from the delay circuit; and a second switch for switching an operation of the first pull-down circuit in response to the output from the delay circuit.

Preferably, the first inverter and inverting rate, that, when the input signal is transitioned from a low to high level is faster than that when it is transitioned from a high to low level.

Preferably, the first inverter includes a first pull-up element and a second pull-down element where a pull-down capacity of the first pull-down element is larger than a pull-up capacity of the first pull-up element.

Preferably, the second inverter an inverting rate when the input signal is transitioned from a high to low level is faster than that when it is transitioned from a low to high level.

Preferably, the second inverter includes a second pull-up element and a second pull-down element where the pull-up capacity of the second pull-up element is larger than the pull-down capacity of the second pull-down element.

Preferably, the delay circuit includes an inverter chain with a plurality of inverters.

Preferably, the first pull-up circuit is a PMOS and the first pull-down circuit is an NMOS.

Preferably, the first switch is a PMOS and the second switch is an NMOS.

BRIEF DESCRIPTION OF THE DRAWINGS

Various features of the instant invention will become apparent from the following description of preferred embodiments taken in conjunction with the accompanying drawings, in which.

DESCRIPTION OF THE PREFERRED EMBODIMENT

Hereinafter, preferred embodiments of the present invention will be explained in detail with reference to the accompanying drawings. First, it should be noted that since these embodiments are presented to illustrate the present invention merely, the right protection scope of the present invention is not limited to those embodiments.

Figure 1:
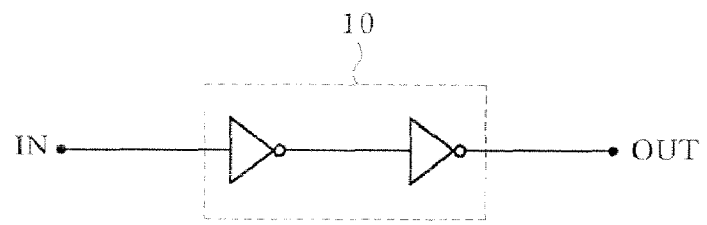
FIG. 1 shows a circuit diagram illustrating the composition of a conventional data transmission apparatus.
Figure 2:
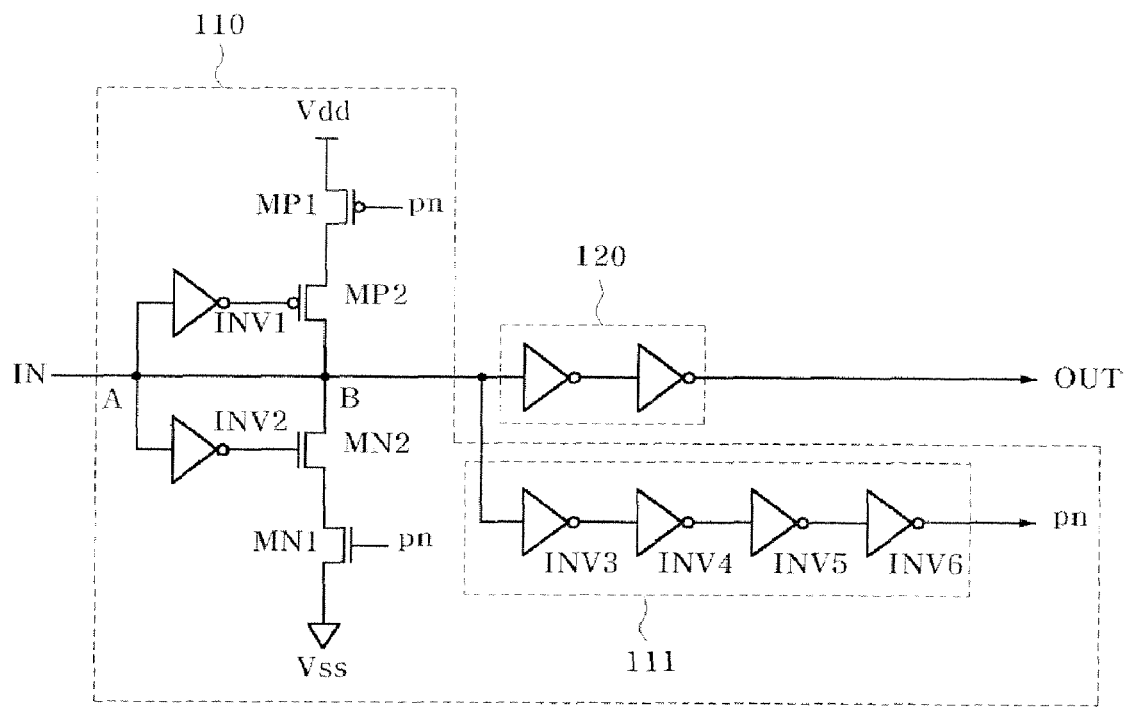
FIG. 2 presents a configuration diagram of a data acceleration device and a data transmission apparatus using the same in accordance with a first embodiment of the present invention.

FIG. 2 shows a circuit diagram illustrating the structure of a data acceleration device and a data transmission apparatus using it in accordance with a first embodiment of the present invention. As shown, the present invention can reduce or prevent a delay that may arise upon data transmission by installing the data acceleration device at a preceding end of the data transmission apparatus. Referring to this, a configuration and operation of the data acceleration device and data transmission apparatus using the same in accordance with the present invention will be described in detail below.

As shown in FIG. 2, the data acceleration device 110 in accordance with the invention comprises a first inverter INV1 for inverting and outputting an input signal IN on a first node A, a second inverter INV2 for inverting and outputting the input signal IN on the first node A, a PMOS MP2 for pull-up driving a second node B which is electrically coupled with the first node A, in response to an output signal from the first inverter INV1, an NMOS MN2 for pull-down driving the second node B, in response to an output signal from the second inverter INV2, a delay circuit 111 for delaying a signal from the second node B by a preset time, a PMOS MP1 for switching the operation of the PMOS MP2 in response to an output signal pn from the delay circuit 111, and an NMOS MN1 for switching the operation of the NMOS MN2 in response to the output signal pn from the delay circuit 111.

Further, the data transmission apparatus of the present invention comprises the data acceleration device 110, and a repeater 120 for amplifying a signal from the data acceleration device 110 to avoid its attenuation, to thereby output an amplified signal. Specifically, the repeater 120, which is composed of an inverter chain of a plurality of inverters, servers to amplify a signal level of data provided via the second node B by a certain level and to provide an amplified signal with no attenuation to an output port.

In the first inverter INV1, it is designed so that the inverting rate, when the input signal IN is transitioned from a low to high level, is faster than that when it is transitioned from high level to low level. Inversely, in the second inverter INV2, it is made such that the inverting rate, when the input signal IN is transitioned from a high to low level is faster than that when it is transitioned from a low to high level.

The delay circuit 111 is organized with an inverter chain of a plurality of inverters INV3 to INV6.

Now, operation of the data acceleration device and data transmission apparatus using the same of the present invention composed as above will be described in detail below.

First of all, if the input signal IN to the node A is at a low level, the signal pn to the gate of the switching elements, PMOS MP1 and NMOS MN1, from the delay circuit 111 is at a low level, thus allowing the PMOS MP1 to turn on and the NMOS MN1 to turn off.

At this time, if the input signal IN is transitioned from a low to high level, then an output from the first inverter INV1 is transitioned to a low level at a rapid rate, turning on the PMOS MP2 that is a pull-up element. Thus, the elements PMOSs MP1 and MP2 are all turned-on and the node B is pull-up driven to a high level at a rapid rate. In a preferred embodiment of the present invention, the first inverter INV1 is designed such that an inverting rate when the input signal IN is transitioned from a low to high level is faster than that when it is transitioned from a high to low level. In particular, the first inverter INV1 may be composed of a pull-up element PMOS and a pull-down element NMOS. Herein, it is designed that the pull-down capacity of the NMOS element is larger than the pull-up capacity of the PMOS element, to thereby perform an inversion operation by reacting more rapidly when the input signal IN is transitioned from a low to high level. In other words, it is designed that the logic threshold level of the first inverter INV1 is relatively low compared to that of a general inverter element.

Thus, in process of transiting the input signal IN from low level to high level, the first inverter INV1 enables the node B to be pull-up driven to high level rapidly by making a turn-on of the PMOS MP2 through a rapid inversion operation. As a result, the input signal IN to the node A that is electrically coupled with the node B rises toward high level at rapid rate.

The rapidly pull-up driven input signal IN is delivered to the repeater 120 which amplifies it to avoid its attenuation and transmits an amplified signal as an output signal OUT. Meanwhile, the signal on the node B transitioned to a high level is delayed by a preset time and is then provided as the output signal pn by the inverter chain INV3 to INV6 constituting the delay circuit 111. This makes the PMOS MP1 turn-off and the NMOS NM1 turn-on.

Thereafter, if the input signal IN is transitioned from a high to low level, then an output from the second inverter INV2 is transitioned to a high level at a rapid rate, turning-on the NMOS MN2 that is the pull-down element. In the above, since the NMOS MN1 was already in a turned-on state, the node B is pull-down driven to a low level at a rapid rate. In a preferred embodiment of the present invention, the second inverter INV2 is designed such that the inverting rate when the input signal IN is transitioned from high level to low level is faster than that when it is transitioned from a low to a high level. In particular, the second inverter INV2 may be comprised of a pull-up element PMOS and a pull-down element NMOS. Herein, it is designed that the pull-up capacity of the PMOS element is larger than the pull-down capacity of the NMOS element, in order to conduct an inversion operation by reacting more rapidly when the input signal IN is transitioned from a high level to a low level. In other words, it is designed such that the threshold logic level of the second inverter INV2 is relatively high compared to that of a general inverter element.

Thus, in process of transiting the input signal IN from a high level to a low level, the second inverter INV2 enables the node B to be pull-down driven to a low level rapidly by turning-on the NMOS MN2 through a rapid inversion operation. As a result, the input signal IN to the node A that is electrically coupled with node B comes down to a low level at a rapid rate.

Then, the rapidly pulled-down driven input signal IN is delivered to the repeater 120 that amplifies it without attenuation and rapidly transmits an amplified signal as the output signal OUT. Meanwhile, the signal on the node B transitioned to a low level is delayed by a preset time and then provided as the output signal pn by the inverter chain INV3 to INV6 constituting the delay circuit 111. This causes the PMOS MP1 to be turned-off and the NMOS MN1 to be turned-on.

As mentioned above, when the input signal IN is transited from low level to high level, the data transmission apparatus in accordance with the present invention allows the first inverter INV1 to conduct an inversion operation rapidly and then the input signal IN on the node A which is electrically coupled with the node B to be pull-up driven to a high level rapidly to transmit it via the repeater 120. However, when the input signal IN is transited from high level to low level, the data transmission apparatus allows the second inverter INV2 to conduct an inversion operation rapidly and then the input signal IN on node A to be pull-down driven to a low level rapidly to transmit it via the repeater 120.

Figure 3:
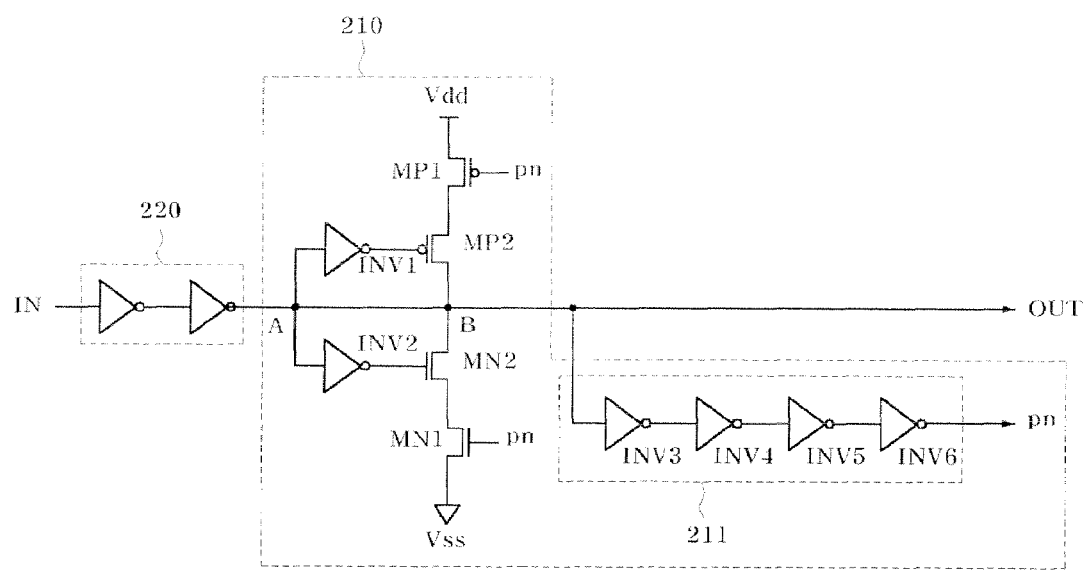
FIG. 3 provides a configuration diagram of a data acceleration device and a data transmission apparatus using the same in accordance with a second embodiment of the present invention.

FIG. 3 presents a configuration diagram of a data acceleration device and a data transmission apparatus using the same in accordance with a second embodiment of the present invention wherein the delay phenomenon that may occur upon the data transmission can be decreased or prevented by installing the data acceleration device at a later portion of the repeater in the data transmission apparatus.

Specifically, as shown, the composition and operation of the data acceleration device 210 in accordance with the second embodiment of the invention are the same as those of the first embodiment as described above except that the repeater 220 is installed at a preceding portion of the data acceleration device 210. Herein, the repeater 220 amplifies the input signal IN to avoid its attenuation and provides an amplified signal to the node A. Thus, in the second embodiment of the invention, the input signal IN is transmitted to the node A through the repeater 220 without its attenuation and then provided to the output port OUT at rapid rate after an acceleration operation by the data acceleration device 210.

As a result, in case of the data transmission apparatus in accordance with the second embodiment of the present invention, the input signal IN is delivered to the node A via the repeater 220 and then to the data acceleration device 210 for its transmission. Herein, when the input signal IN is transitioned from a low to high level, the data transmission apparatus in accordance with the present invention allows the first inverter INV1 to conduct an inversion operation rapidly and then the input signal IN on the node A which is electrically coupled with node B to be pull-up driven to a high level rapidly to transmit it via the repeater 220. However, when the input signal IN is transitioned from a high to low level, the data transmission apparatus enables the second inverter INV2 to conduct an inversion operation rapidly and then the input signal IN on the node A which is electrically coupled with the node B to be pull-down driven to low a level rapidly to transmit it.

As described above, the data acceleration device and the data transmission apparatus in accordance with the first and second embodiments of the present invention can prevent the entire signal delay amount upon data transmission and improve the performance of the semiconductor chip by accelerating the data signal rapidly.

As a result, the data acceleration device and the data transmission apparatus using the same in accordance with the present invention can improve the performance of the semiconductor chip by preventing the delay phenomenon that may arise upon data transmission in data transmission line of the semiconductor chip with a longer transmission distance and a larger load by accelerating data signal to be transmitted rapidly.

While the present invention has been described with respect to the particular embodiments, it will be apparent to those skilled in the art that various changes and modifications may be made without departing from the spirit and scope of the invention as defined in the following claims.

What is claimed is:

1. A data acceleration device comprising:
 a pull-up driver for driving a pull-up in response to a signal level on a first node;
 a pull-down driver for driving a pull-down in response to the signal level on the first node;

a delay circuit for delaying a signal from a second node, which is electrically coupled with the first node, by a preset time to output a delayed signal;
a first switch for connecting the pull-up driver with a first voltage source in response to an output signal from the pull-up driver and the output signal from the delay circuit; and
a second switch for connecting the pull-down driver with a second voltage source in response to an output signal from the pull-down driver and the output signal from the delay circuit.

2. The device as set force in claim 1, wherein the first pull-up driver is a first inverter for inverting the signal from the first node to provide an inverted signal.

3. The device as set force in claim 2, wherein in the first inverter with an inverting rate, such that when the signal from the first node is transitioned from a low to high level is faster than that when it is transitioned from a high to low level.

4. The device as set force in claim 3, wherein the first inverter includes a first pull-up element and a first pull-down element where the pull-down capacity of the first pull-down element is larger than the pull-up capacity of the first pull-up element.

5. The device as set force in claim 1, wherein the first pull-down driver is a second inverter for inverting the signal from the first node to produce an inverted signal.

6. The device as set force in claim 5, wherein in the second inverter the inverting rate when the signal from the first node is transitioned from a high to low level is faster than that when it is transitioned from a low to high level.

7. The device as set force in claim 6, wherein the second inverter includes a second pull-up element and a second pull-down element where a pull-up capacity of the second pull-up element is larger than the pull-down capacity of the second pull-down element.

8. The device as set force in claim 1, wherein the delay circuit includes an inverter chain with a plurality of inverters.

9. The device as set force in claim 1, wherein the pull-up circuit comprising:
a first PMOS for pull-up driving the second node, in response to an output signal from the pull-up driver; and
a second PMOS for switching an operation of the first pull-up circuit in response to an output signal from the delay circuit.

10. The device as set force in claim 1, wherein the pull-down circuit comprising:
a first NMOS for pull-down driving the second node, in espouse to an output signal from the pull-down driver; and
a second NMOS for switching an operation of the pull-down circuit in response to an output signal from the delay circuit.

11. A data transmission apparatus comprising:
a data acceleration device, wherein the device includes a first inverter for inverting and outputting an input signal on a first node;
a second inverter for inverting and outputting the input signal on the first node; a delay circuit for delaying a signal from a second node, which is electrically coupled with the first node, by a preset time to output a delayed signal; a pull-up circuit for pull-up driving the second node, in response to an output signal from the first inverter and the output signal from the delay circuit; and a pull-down circuit for pull-down driving the second node, in response to an output signal from the second inverter and the output signal from the delay circuit; and
a repeater for amplifying an output signal from the data acceleration device to avoid an attenuation of the signal, to thereby output an amplified signal.

12. The apparatus as set force in claim 11, wherein in the first inverter an inverting rate when the input signal is transitioned from a low to high level is faster than that when it is transitioned from a high to low level.

13. The apparatus as set force in claim 12, wherein the first inverter includes a first pull-up element and a second pull-down element where the pull-down capacity of the first pull-down element is larger than the pull-up capacity of the first pull-up element.

14. The apparatus as set force in claim 11, wherein the second inverter an inverting rate when the input signal is transitioned from high to low level is faster than that when it is transitioned from a low to high level.

15. The apparatus as set force in claim 14, wherein the second inverter includes a second pull-up element and a second pull-down element where the pull-up capacity of the second pull-up element is larger than a pull-down capacity of the second pull-down element.

16. The apparatus as set force in claim 11, wherein the delay circuit includes an inverter chain with a plurality of inverters.

17. The device as set force in claim 11, wherein the pull-up circuit comprising:
a first PMOS for pull-up driving the second node, in response to an output signal from the pull-up driver; and
a second PMOS for switching an operation of the first pull-up circuit in response to an output signal from the delay circuit.

18. The device as set force in claim 11, wherein the pull-down circuit comprising:
a first NMOS for pull-down driving the second node, in response to an output signal from the pull-down driver; and
a second NMOS for switching an operation of the pull-down circuit in response to an output signal from the delay circuit.

19. A data transmission apparatus comprising:
a repeater for amplifying an input signal to avoid attenuation of the signal, to thereby output an amplified signal onto a first node; and
a data acceleration device, wherein the device includes a first inverter for inverting and outputting the signal on the first node;
a second inverter for inverting and outputting the signal on the first node; a delay circuit for delaying a signal from a second node, which is electrically coupled with the first node, by a preset time to output a delayed signal;
a pull-up circuit for pull-up driving the second node, in response to an output signal from the first inverter and the output signal from the delay circuit; and a pull-down circuit for pull-down driving the second node, in response to an output signal from the second inverter and the output signal from the delay circuit.

20. The apparatus as set force in claim 19, wherein in the first inverter an inverting rate when the input signal is transitioned from a low to high level is faster than that when it is transitioned from a high to low level.

21. The apparatus as set force in claim 20, wherein the first inverter includes a first pull-up element and a second pull-down element where the pull-down capacity of the first pull-down element is larger than the pull-up capacity of the first pull-up element.

22. The apparatus as set force in claim 19, wherein the second inverter an inverting rate when the input signal is transitioned from high to low level is faster than that when it is transitioned from a low to high level.

23. The apparatus as set force in claim 22, wherein the second inverter includes a second pull-up element and a second pull-down element where the pull-up capacity of the second pull-up element is larger than a pull-down capacity of the second pull-down element.

24. The apparatus as set force in claim 19, wherein the delay circuit includes an inverter chain with a plurality of inverters.

25. The device as set force in claim 19, wherein the pull-up circuit comprising:
 a first PMOS for pull-up driving the second node, in response to an output signal from the pull-up driver; and
 a second PMOS for switching an operation of the first pull-up circuit in response to an output signal from the delay circuit.

26. The device as set force in claim 19, wherein the pull-down circuit comprising:
 a first NMOS for pull-down driving the second node, in response to an output signal from the pull-down driver; and
 a second NMOS for switching an operation of the pull-down circuit in response to art output signal from the delay circuit.

* * * * *

UNITED STATES PATENT AND TRADEMARK OFFICE
CERTIFICATE OF CORRECTION

PATENT NO.         : 7,319,342 B2
APPLICATION NO.    : 11/671564
DATED              : January 15, 2008
INVENTOR(S)        : Ki C. Kwean It is certified that error appears in the above-identified patent and that said Letters Patent is hereby corrected as shown below:

In the Claims:

At Column 7, line 12, "force" should be -- forth --.

At Column 7, line 15, "force" should be -- forth --.

At Column 7, line 20, "force" should be -- forth --.

At Column 7, line 25, "force" should be -- forth --.

At Column 7, line 28, "force" should be -- forth --.

At Column 7, line 32, "force" should be -- forth --.

At Column 7, line 37, "force" should be -- forth --.

At Column 7, line 40, "force" should be -- forth --.

At Column 7, line 48, "force" should be -- forth --.

At Column 7, line 51, "espouse" should be -- response --.

At Column 8, line 8, "force" should be -- forth --.

At Column 8, line 12, "force" should be -- forth --.

At Column 8, line 17, "force" should be -- forth --.

At Column 8, line 17, "wherein the" should be -- wherein in the --.

At Column 8, line 21, "force" should be -- forth --.

At Column 8, line 26, "force" should be -- forth --.

At Column 8, line 29, "force" should be -- forth --.

At Column 8, line 37, "force" should be -- forth --.

At Column 8, line 64, "force" should be -- forth --.

At Column 9, line 1, "force" should be -- forth --.

At Column 9, line 6, "force" should be -- forth --.

UNITED STATES PATENT AND TRADEMARK OFFICE
CERTIFICATE OF CORRECTION

PATENT NO.        : 7,319,342 B2
APPLICATION NO. : 11/671564
DATED             : January 15, 2008
INVENTOR(S)       : Ki C. Kwean It is certified that error appears in the above-identified patent and that said Letters Patent is hereby corrected as shown below:

At Column 9, line 6, "wherein the" should be -- wherein in the --.

At Column 9, line 10, "force" should be -- forth --.

At Column 9, line 16, "force" should be -- forth --.

At Column 10, line 1 "force" should be -- forth --.

At Column 10, line 9, "force" should be -- forth --.

At Column 10, line 15, "art" should be -- an --.

Signed and Sealed this

Fifth Day of August, 2008

JON W. DUDAS
*Director of the United States Patent and Trademark Office*